United States Patent [19]

Frankowski

[11] 4,041,374

[45] Aug. 9, 1977

[54] INTERELECTRODE OPEN AND SHORT CIRCUIT TESTER

[75] Inventor: Richard Edward Bronislaw Frankowski, Toronto, Canada

[73] Assignee: RCA Corporation, New York, N.Y.

[21] Appl. No.: 667,119

[22] Filed: Mar. 15, 1976

[51] Int. Cl.² .......................................... G01R 31/024
[52] U.S. Cl. ........................... 324/20 CR; 324/158 D
[58] Field of Search .......... 324/20 CR, 158 D, 73 R, 324/73 AT; 316/27

[56] References Cited

U.S. PATENT DOCUMENTS

| 2,750,559 | 6/1956 | Smith et al. | 324/158 D |
| 3,004,213 | 10/1961 | Reid | 324/20 R |

OTHER PUBLICATIONS

David L. Hillhouse, "Circuit for Impulse Testing of Gas-Tube Lightning Arresters," IEEE Transactions on Communications, vol. Com 20, No. 5, Oct. 1972, pp. 936-941.

Primary Examiner—M. Tokar
Attorney, Agent, or Firm—Glenn H. Bruestle; William H. Murray

[57] ABSTRACT

A series of input pulses are applied to one terminal of an electron tube having at least two electrodes. As a result of interelectrode capacitance, the input pulses produce output pulses at the other electrodes, the output pulses having amplitudes which are substantially less than those of the input pulses. Level detection means is used to detect interelectrode open and short circuits by measuring the amplitudes of the output pulses.

11 Claims, 14 Drawing Figures

INTERELECTRODE OPEN AND SHORT CIRCUIT TESTER

BACKGROUND OF THE INVENTION

This invention relates to apparatus for testing electron tubes and more particularly for apparatus for production type detection of interelectrode open and short circuits in a television picture tube.

In production type fabrication of television picture tubes, it is highly desirable to automatically check the electrical characteristics of the components of the tube both before and after the components have been assembled into a finished tube. Among the tests to be made is a determination of the existence of short circuits between electrodes or open circuits between the terminal pins and the electrodes themselves. In a conventional color television picture tube having three cathode electrodes, a G1 electrode and a G2 electrode, there should be no electrical continuity between these electrodes. Consequently, it is essential to test for short circuits between the G1 and G2 electrodes, the three cathode electrodes and the G1 electrode and between the cathode electrodes themselves.

In addition to checking for short circuits, it is also necessary to check for the existence of open circuits which may present between the terminal pins of the tube and their associated electrodes. It is expedient to be able to test for open circuits by making the measurement connections to the terminal pins only without having to contact the actual electrode itself. This is not only expedient but imperative when the electrodes have been sealed within the tube.

SUMMARY OF THE INVENTION

An apparatus, for measuring open and short circuits between electrodes of an electron tube having at least two electrodes, comprises means for applying, during an open circuit test interval, at least one input pulse to a terminal of a first electrode of the electron tube. Each input pulse has a predetermined amplitude and duration. Also included are means for detecting, during the open circuit test interval, the amplitude of each open circuit test output pulse produced at a terminal of a second electrode of the electron tube in response to each of the open circuit test interval input pulses. The apparatus also includes means for indicating an open circuit upon measurement of an open circuit test interval output pulse amplitude having a magnitude which is less than a predetermined minimum value. Also included is means for applying, during at least one short circuit test interval, at least one input pulse to the terminal of an electrode, each input pulse having a predetermined amplitude. Also included is means for detecting, during each short circuit test interval, the amplitude of each output pulse produced at the terminal of at least one other electrode in response to each of the short circuit test interval input pulses. Finally, the apparatus includes means for indicating a short circuit upon measurement of a short circuit test interval output pulse amplitude having a magnitude which exceeds a predetermined maximum value.

DETAILED DESCRIPTION

Figure 1:
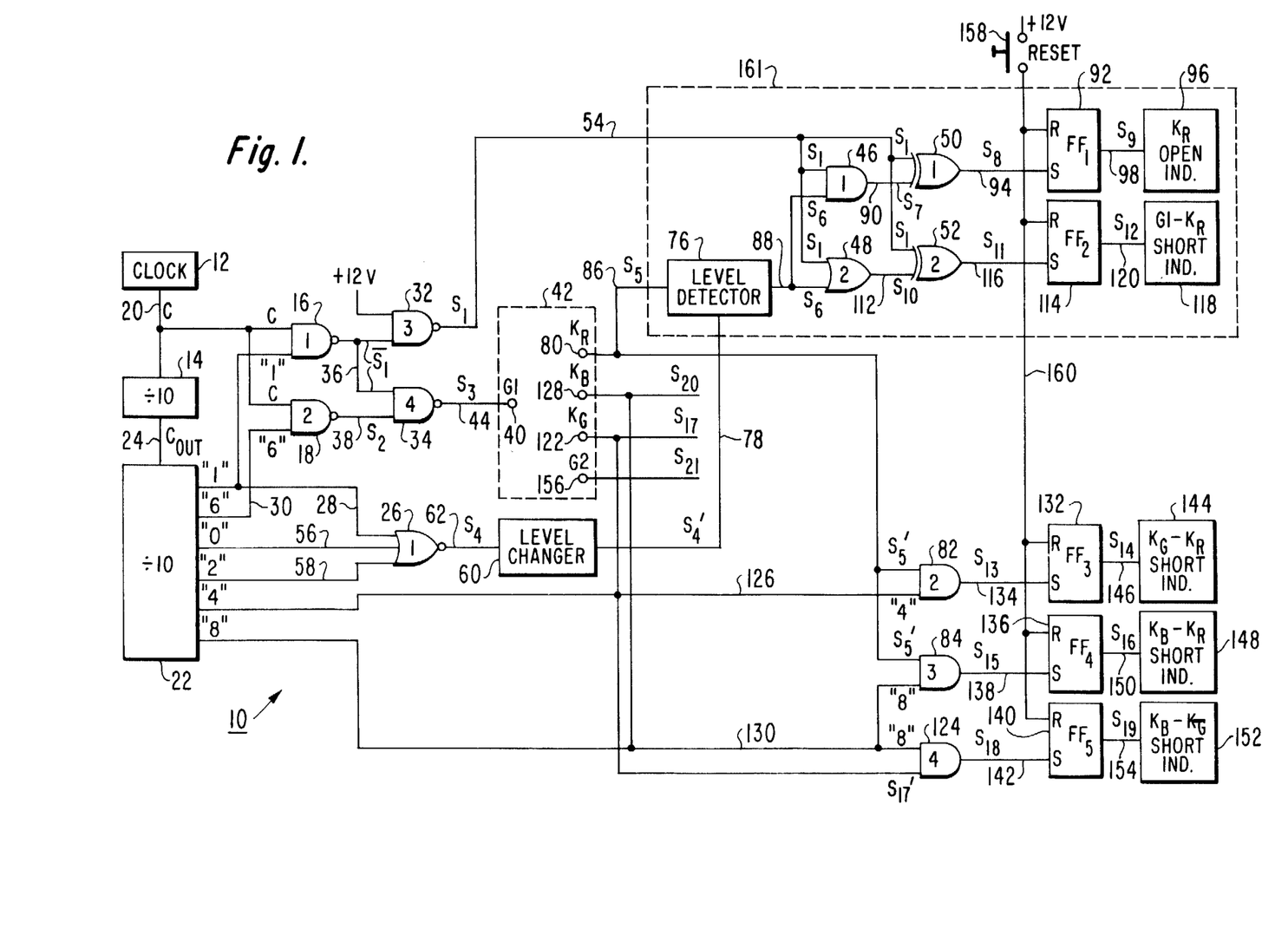
FIG. 1 is a logic block diagram of the apparatus of the present invention.
Figure 2A:
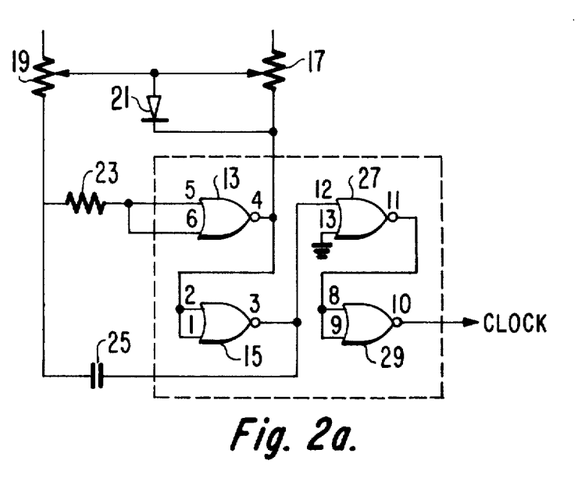
FIG. 2a is a schematic logic diagram of a clock circuit portion of FIG. 1.

Referring to FIG. 1, there is shown a logic diagram of the open and short circuit test apparatus of the present invention, generally referred to as 10. The apparatus 10 includes a clock circuit 12 for generating a clock signal "C" having a frequency of 12 kilohertz. The clock circuit 12 comprises, for example, a type CD4001AE "COS/MOS Quad-two-input NOR Gate" Digital Integrated Circuit as described in the "RCA COS/MOS Integrated Circuits" Databook No. SSD-203C. As shown in FIG. 2a, a first 13 and a second 15 two-input NOR gates are interconnected with a first 17 and a second 19 variable resistor as well as a diode 21, a resistor 23 and a capacitor 25 to form an astable multivibrator with duty cycle control as described in "ICAN-6267" on pages 531-534 of the above referenced "Databook". The output of the multivibrator is coupled to a first inverter comprising a third two-input NOR gate 27. The output of the first inverter is coupled to a second inverter comprising a fourth two-input NOR gate 29. The output of the second inverter is the clock C shown in FIG. 2b. The clock signal C is output on pin 10 of the integrated circuit and is coupled to a first divide by ten network 14, an input of a first two-input NAND gate 16 and an input of a second two-input NAND gate 18 through a branching conductor 20.

The first divide by ten network 14 comprises a type CD4017AE "COS/MOS Decade Counter/Divider" as described in the previously referenced RCA Databook. The clock signal C is input on pin 14 of the integrated circuit (see FIG. 12.1, page 94 of the referenced RCA Databook for the logic diagram and pin numbers) and a carry out signal $C_{out}$, which completes one cycle every 10 clock input cycles (see FIG. 3), is coupled from pin 12 of the first divide by ten network 14 to a second divide by ten network 22 through a conductor 24. The second divide by ten network 22 also comprises a type CD4017AE Decade Counter/Divider. The carry out signal $C_{out}$ is input on pin 14 and serves as a clock signal for the second divide by ten network 22. Although the second divide by 10 network 22 provides 10 decoded decimal outputs, (see FIG. 12.1, page 94 of referenced RCA Databook), only the "0", "1", "2", "4", "6" and "8" pulses (see FIG. 3) are utilized. These pulses will henceforth be referred to as gate pulses.

The 1 gate pulse signal is coupled to the other input of the first two input NAND gate 16 and an input of a three input NOR gate 26 through a branching conductor 28. The 6 gate pulse signal is coupled to the other input of the second two input NAND gate 18 through a conductor 30. The output, gated clock signal $\overline{S_1}$, of the first NAND gate 16 is coupled to an input of a third two input NAND gate 32 and an input of a fourth two input NAND gate 34 through a branching conductor 36. The other input of the third NAND gate 32 is connected to a constant +12 volt signal which is the equivalent of a logical 1. The output, gated clock signal $S_2$, of the second NAND gate 18 is conneced to the other input of the fourth NAND gate 34 through a conductor 38. The first, second, third and fourth NAND gates, 16, 18, 32 and 34 respectively, can be contained in a single integrated circuit, for example, a type CD4011AE "Quad Two Input COS/MOS NAND Gates" as described in the previously referenced RCA Databook. The output, gated clock signal $S_3$, of the fourth NAND gate 34 is coupled to a G1 terminal pin 40 in a mount assembly connector 42 through a conductor 44. The gated clock signal $S_1$ from the third NAND gate 32 is coupled to one input of a first two input AND gate 46, one input of a two input OR gate 48, one input of a first two input exclusive OR gate 50 and one input of a second two input exclusive OR gate 52 though a branching conductor 54. The O gate pulse signal from the second divide by ten network 22 is coupled to an input of the three input NOR gate 26 through a conductor 56. The 2 gate pulse signal is coupled to an input of the three input NOR gate 26 through a conductor 58. The three input NOR gate can be, for example, one of the gates contained in a type CD4000AE "COS/MOS NOR Gate" Digital Integrated Circuit as described in the previously referenced RCA Databook.

Figure 4:
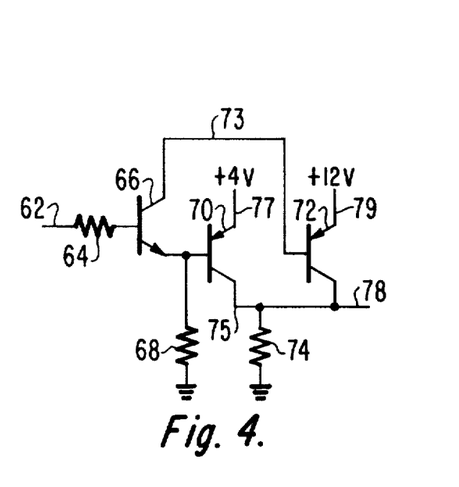
FIG. 4 is a schematic diagram of a level changer network portion of the apparatus of the present invention.

The output, $S_4$, of the three input NOR gate 26 is coupled to a level changer network 60 through a conductor 62. As shown in FIG. 4, the level changer network comprises a first resistor 64, one terminal of which is connected to the conductor 62 and the other terminal connected to the base of a first transistor 66. The emitter of the first transistor 66 is connected to ground through a second resistor 68 and to the base of a second transistor 70. The collector of the first transistor 66 is connected to the base of a third transistor 72, through a conductor 73. The collector of the second transistor 70 is connected to ground through a third resistor 74 and to the collector of the third transistor 72 through a branching conductor 75. The emitter of the second transistor 70 is connected to a +4 volt power supply (not shown) through a conductor 77. The emitter of the third transistor 72 is connected to a +12 volt power supply (not shown) through a conductor 79. The first transistor 66 is, for example, a type 2N3565. The second and third transistors 70 and 72 are each, for example, a type 2N 5193.

As shown in FIG. 1, the output $S_4'$ of the level changer 60 is coupled to a level detector 76 through a conductor 78. The level detector 76 comprises, for example, a type CD4050AE Non-inverting "COS/-MOS Hex Buffer/Converter", as described in the RCA Databook as previously referenced. The output $S_4'$ of the level changer 60 functions as the supply voltage $V_{cc}$ for the Hex Buffer and is connected to pin 1 thereof (see page 252 of the referenced RCA Databook for the logic diagram and pin numbers). A $K_R$ terminal pin 80 of the mount assembly connector 42 is electrically connected to a first input $S_5$ (pin 3) of the level detector 76, one input of a second two input AND gate 82, and one input of a third two input AND gate 84 through a branching conductor 86. A first output $S_6$ (pin 2) of the level detector 76, which is related to the first input $S_5$ through a buffer, is coupled to the other input of the first two input AND gate 46 and the other input of the two input OR gate 48 through a branching conductor 88.

Figure 5:
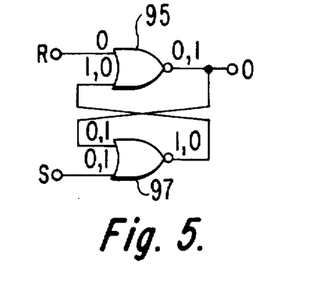
FIG. 5 is a logic diagram of a typical flip-flop used in the apparatus of the present invention.

The output $S_7$ of the first AND gate 46 is coupled to the other input of the first exclusive OR gate 50 through a conductor 90. The output $S_8$ of the first exclusive OR gate 50 is coupled to the set input of a first set-reset flip-flop 92 through a conductor 94. The first set-reset flip-flop 92 comprises, for example, a first 95 and a second 97 NOR gate of the type CD4001AE "Quad Two-Input NOR Gate" as described in the previously referenced RCA Databook. The first 95 and second 97 NOR gates are interconnected as shown in FIG. 5 with the output of the first NOR gate 95 coupled to a first input of the second 97 NOR gate. The output of the second 97 NOR gate is coupled to a second input of the first 95 NOR gate. A first input of the first 95 NOR gate comprises a reset input; a second input of the second 97 NOR gate comprises the set input; and the output of the first 95 NOR gate comprises an output of this set-reset flip-flop configuration. The output $S_9$ of the first flip-flop 92 is coupled to a first indicator circuit 96 through a conductor 98. The first indicator circuit 96 comprises, for example, a transistor switch which switches power to a light emitting diode.

Figure 6:
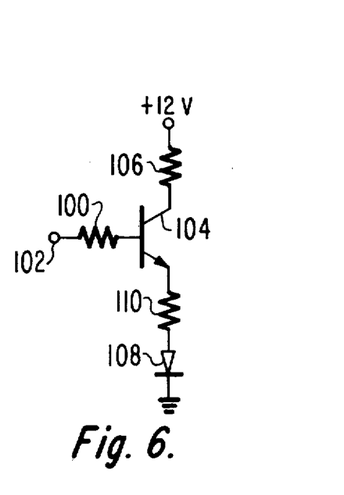
FIG. 6 is a schematic diagram of a typical indicator circuit used in the apparatus of the present invention.

As shown in FIG. 6, the first indicator circuit 96 comprises a first resistor 100, one terminal of which is connected to an input terminal 102 and the other terminal connected to the base of a transistor 104. The transistor is, for example, a type 2N 3565. The collector of the transistor 104 is connected to a +12 volt power supply (not shown) through a second resistor 106. The emitter of the transistor 104 is connected to one terminal of a light emitting diode 108 through a third resistor 110. The other terminal of the light emitting diode is connected to ground.

The output $S_{10}$ of the OR gate 48 is coupled to the other input of the second exclusive OR gate 52 through a conductor 112. The output $S_{11}$ of the second exclusive OR gate 52 is coupled to the set input of a second flip-flop 114 through a conductor 116. The second flip-flop 114 comprises the same type of components as included in the flip-flop 92, interconnected as shown in FIG. 5. The output $S_{12}$ of the second flip-flop 114 is coupled to a second indicator circuit 118 through a conductor 120. The second indicator circuit 118 is the same type as the first indicator circuit 96 (see FIG. 6).

The 4 gate pulse signal from the second divide by ten network 22 is coupled to a $K_G$ terminal pin 122 of the mount assembly connector 42, the other input of the second AND gate 82 and one input of a fourth two input AND gate 124 through a branching conductor 126. The 8 gate pulse signal from the second divide by 10 network 22 is coupled to a $K_B$ terminal pin 128 of the mount assemby connector 42, the other input of the third AND gate 84 and the other input of the fourth AND gate 124 through a branching conductor 130.

The output $S_{13}$ of the second AND gate 82 is coupled to the set input of a third flip-flop 132 through a conductor 134. The output $S_{15}$ of the third AND gate 84 is connected to the set input of a fourth flip-flop 136 through a conductor 138. The output $S_{18}$ of the fourth AND gate 124 is connected to the set input of the fifth flip-flop 140 through a conductor 142. The first, second, third and fourth AND gates, 46, 82, 84 and 124 respectively, can all be contained in a single integrated circuit, for example, a type CD4081B "COS/MOS AND Gates" as described in the RCA Databook previously referenced. The third, fourth and fifth flip-flops 132, 136 and 140 each comprise the same type circuit as that described for the first flip-flop 92 (see FIG. 5).

The output $S_{14}$ of the third flip-flop 132 is connected to a third indicator circuit 144 through a conductor 146. The output $S_{16}$ of the fourth flip-flop 136 is coupled to a fourth indicator circuit 148 through a conductor 150. The output $S_{19}$ of the fifth flip-flop 140 is coupled to a fifth indicator circuit 152 through a conductor 154. The third, fourth and fifth indicator circuits 144, 148 and 152 respectively, each comprise the same type of circuit as that described for the first indicator circuit 96 (see FIG. 6).

The operation of the open and short circuit test apparatus 10 is as follows. It should be noted that although the following describes the use of the apparatus for testing open and short circuits in a color television tube mount assembly, before the assembly has been inserted into the tube, the apparatus may be used for testing after insertion and evacuation of the tube. It may also be used to test any vacuum tube electrode assemblies having at least two electrodes which are capacitively coupled, before or after the electrode assemblies have been sealed in a vacuum tube assembly.

A color television tube mount assembly (not shown) including three cathodes $K_R$, $K_B$ and $K_G$; a G1 grid; and a G2 grid, is inserted into the mount assembly connector 42. Insertion causes the G1 grid to be electrically connected to the G1 terminal pin 40, the cathodes $K_R$, $K_B$ and $K_G$ to be electrically connected to the $K_R$, $K_B$ and $K_G$ terminal pins, 80, 128 and 122 respectively, and the G2 grid to be electrically connected to a G2 terminal pin 156. The flip-flop which drive the indicator circuits are reset by momentarily depressing a reset switch 158 which causes a +4 volt reset signal to be applied to the reset input of each flip-flop through a branching conductor 160. Application of the reset signal causes all indicators to be turned off since, as shown in FIG. 5, a +4 volt signal applied to the reset input R causes a logical 0 (0 volts) to appear at the output terminal 0. The 0 volt signal will appear at the input terminal 102 of the indicator circuit and will cause the transistor 104 to be nonconductive thereby preventing power from being applied to the light emitting diode 108 (see FIG. 6).

Figure 2B:
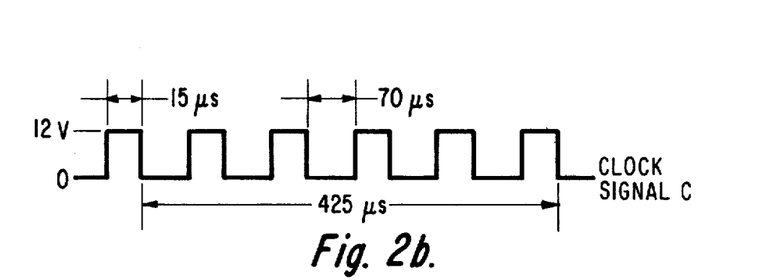
FIG. 2b is a timing diagram of clock signal C.
Figure 3:
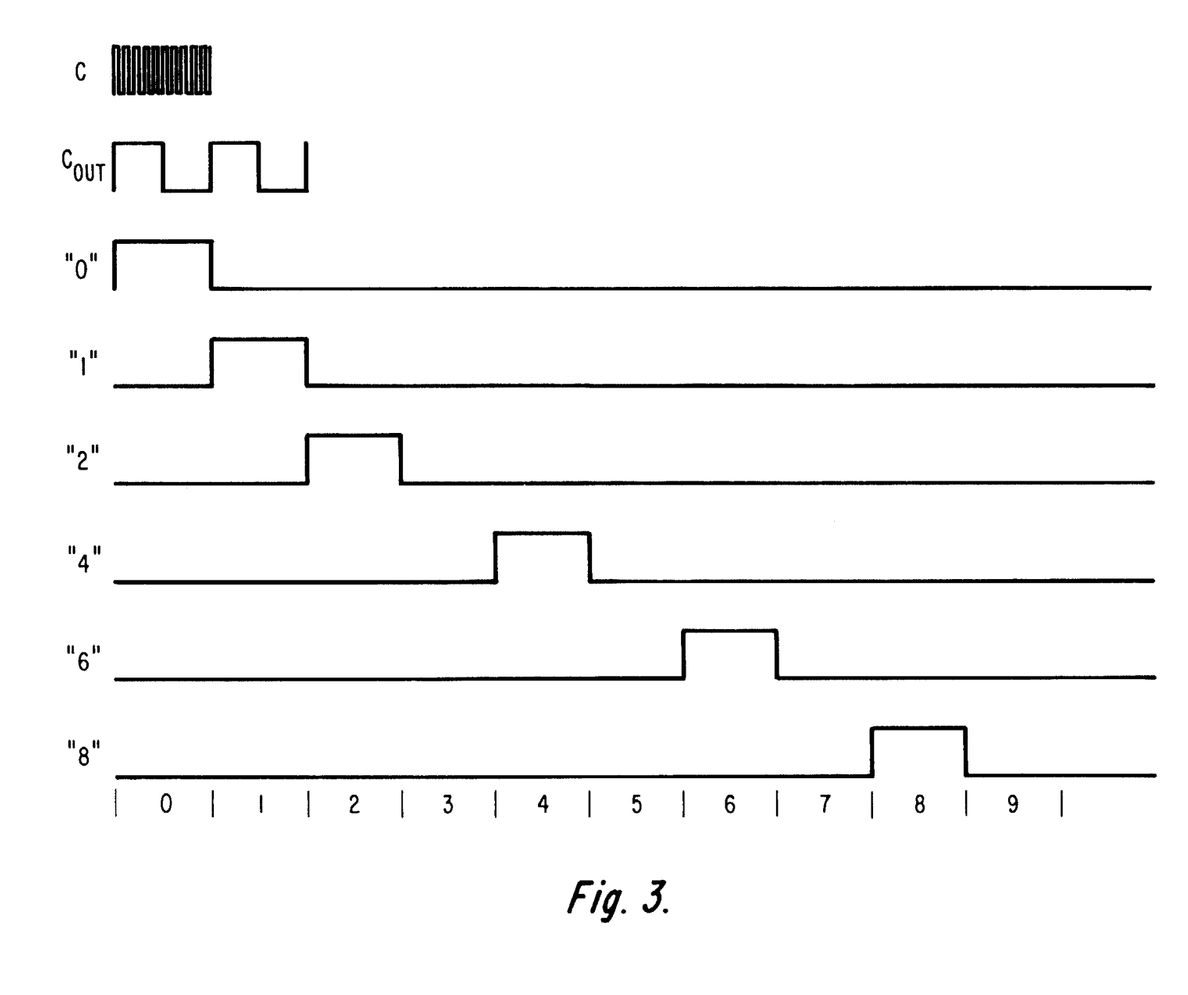
FIG. 3 is a timing diagram showing the relationship of a plurality of gate pulses.
Figure 7:
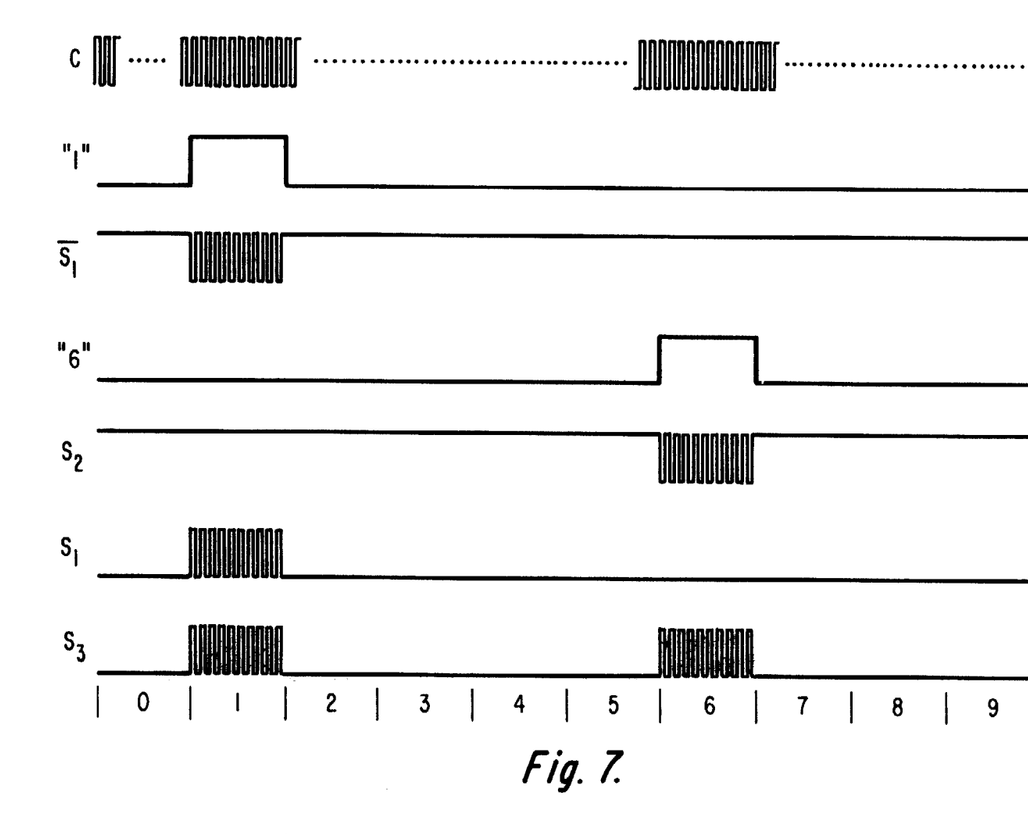
FIG. 7 is a timing diagram showing how various signals are used to obtain a gated clock pulse signal.

The clock signal C shown in FIGS. 2b and 3 is generated causing the first divide by ten network 14 to generate the carryout signal $C_{out}$ and the second divide by 10 network to generate the 0, 1, 2, 4, 6 and 8 gate pulse signals as shown in the timing diagram depicted in FIG. 3. In the embodiment described herein, G1-$K_R$, $K_B$, $K_G$ and G2 open circuits are measured during the 1 gate pulse interval; $K_G$-$K_R$ short circuits during the 4 gate pulse interval; G1-$K_R$, $K_B$, $K_G$ and G2 short circuits during the 6 gate pulse interval; and $K_B$-$K_R$ and $K_G$ short circuits during the 8 gate pulse interval. The clock signal C and the 1 gate pulse are nanded by the first NAND gate 16 which generates the gated clock signal $\overline{S_1}$ as shown in the timing diagram depicted in FIG. 7. The clock signal C and the 6 gate pulse are nanded by the second NAND gate 18 which generates the gated clock signal $S_2$ as shown in FIG. 7. The $\overline{S_1}$ and $S_2$ signals are nanded by the fourth NAND gate 34 which generates the gated clock signal $S_3$. As shown in FIG. 7, the $S_3$ signal comprises a sequence of 10 clock pulses occurring during each of the 1 and 6 gate pulse periods. This signal is applied to the G1 grid of the mount assembly under test through the G1 terminal pin 40.

Figure 8:
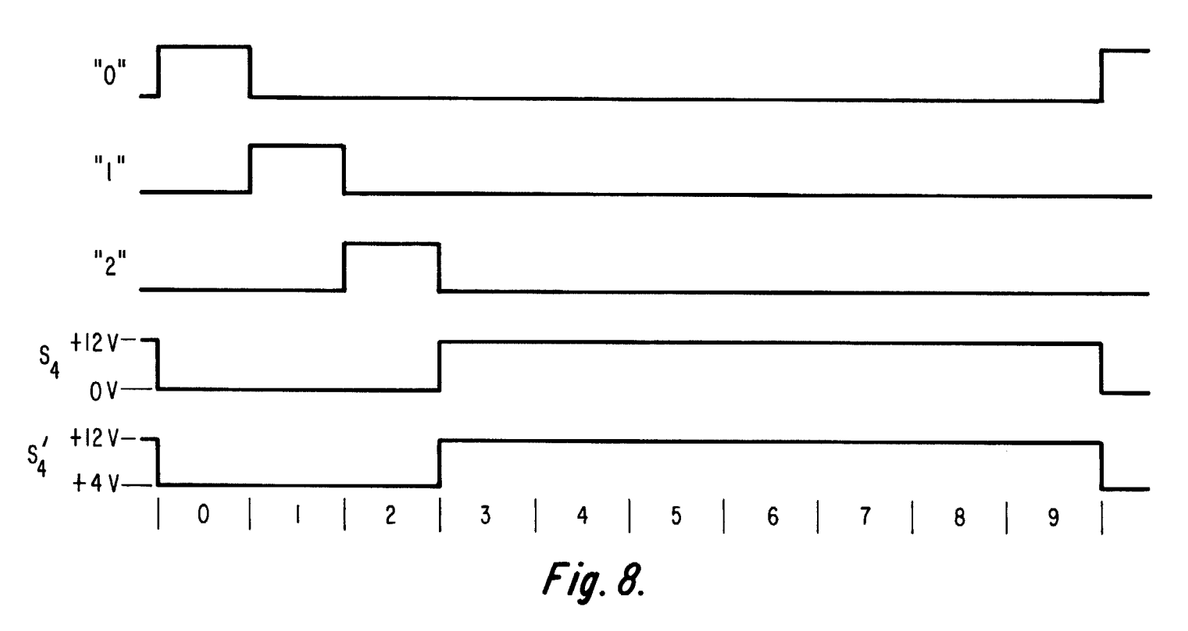
FIG. 8 is a timing diagram showing how various signals are used to obtain a level changing signal.

The 0, 1 and 2 gate pulse signals are applied to the three input NOR gate 26 which generates the $S_4$ signal as shown in the timing diagram of FIG. 8. The $S_4$ signal is applied to the level changer circuit 60. Referring to FIG. 4, when $S_4$ is in a 0 logical state (0 volt), the first transistor 66 turns off causing the second transistor 70 to turn on which in turn causes +4 volts to be applied to the output conductor 78. When $S_4$ is in a logical 1 state (+12 volts), the first transistor 66 turns on causing the second transistor 70 to turn off which in turn causes third transistor 72 to turn on, applying +12 volts to the output conductor 78. Consequently, the $S_4'$ signal, as shown in FIG. 8, appears at the output of the level changer 60. The $S_4'$ signal has an amplitude of +4 volts during the 0, 1 and 2 gate pulse periods and +12 volts during the 3 through 9 gate pulse periods inclusive.

The $S_4'$ signal is applied to the $v_{cc}$ terminal (pin 1) of the CD4050AE "COS/MOS Hex Buffer/Converter Integrated Circuit" (see page 252 of the previously referenced RCA Databook). When the amplitude of the $S_4'$ signal is +4 volts, the minimum input voltage $V_{NH}$ which will cause the output logic level to change state is +2.8 volts (70% of +4 volts, see pages 253–254 of the referenced RCA Databook). When the amplitude of the $S_4'$ signal is +12 volts, the maximum input voltage $V_{NL}$ which will not cause the output logic level to change state is +3.6 volts (30% of +12 volts, see pages 253–254).

Figure 9:
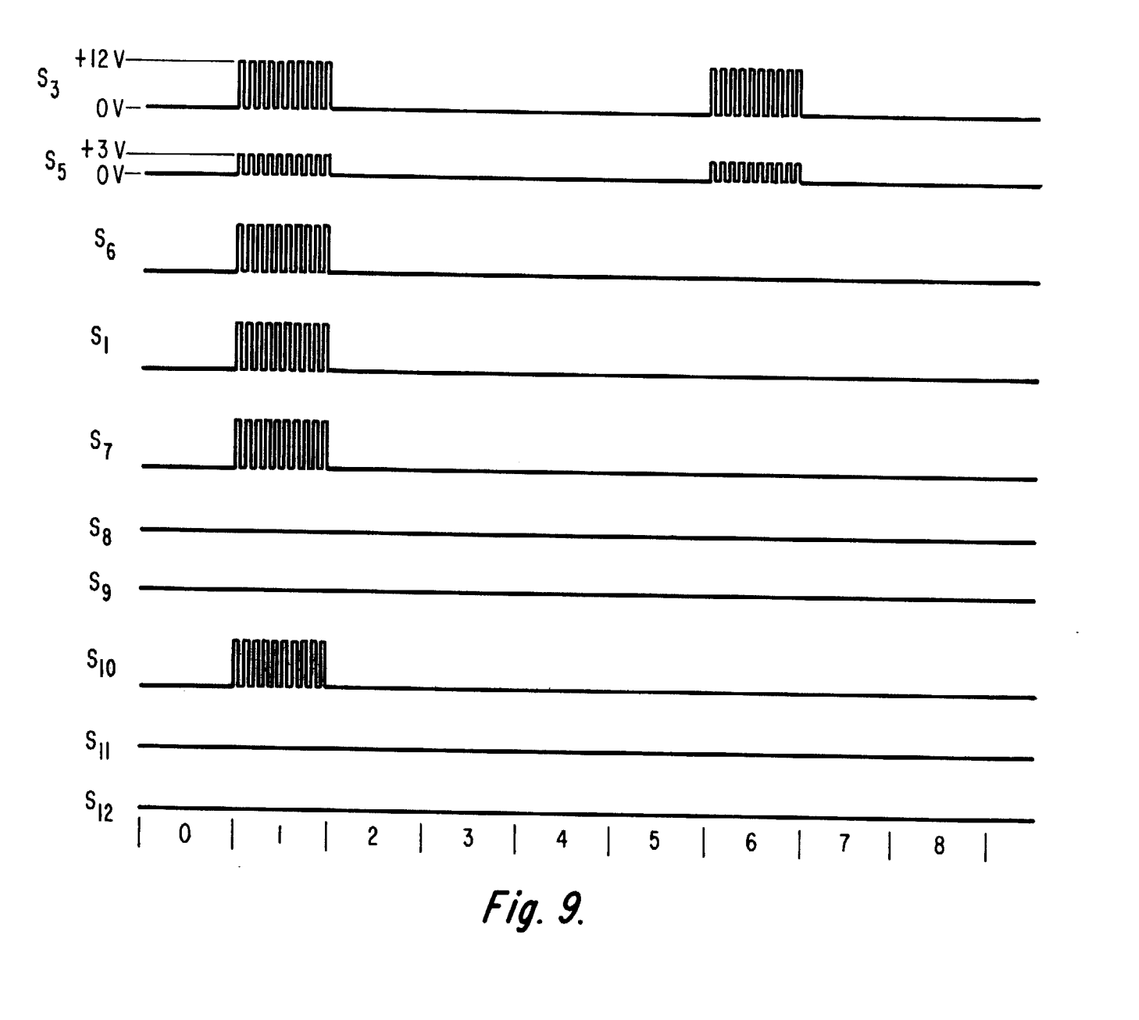
FIG. 9 is a timing diagram showing the timing sequence for a mount assembly having no open or short circuits.

FIG. 9 depicts the timing sequence for a mount assembly having no open or short circuits. Due to the interelectrode capacitances present in the normal mount assembly, the $S_3$ signal applied to the G1 electrode will cause an output signal $S_5$ to appear at the G2 grid $K_R$, $K_G$ and $K_B$ terminals. As shown in FIG. 9, $S_5$ comprises ten clock pulses occurring during each of the 1 and 6 gate pulse time periods as does $S_3$. However, the amplitude of the $S_5$ clock pulses is approximately +3 volts. Since $V_{NH}$ is +2.8 volts during the 0, 1 and 2 gate pulse periods, all of the +3 volt clock pulses occurring during the 1 gate pulse time period will cause the output logic level of the CD4050AE to change state. Also, $V_{NL}$ is +3.6 volts during the 3 through 9 gate pulse periods inclusive. As a result, the +3 volt clock pulses occurring during the 6 gate pulse interval will not cause the output logic of the CD4050AE to change state. Consequently, the output $S_6$ from the level detector 76 comprises ten clock occurring during the 1 gate pulse period only, as shown in the timing diagram of FIG. 9.

The $\overline{S_1}$ signal (see FIG. 7) is nanded with a 1 logic level (+12 volts) by the third NAND gate 32. The output $S_1$ from the third NAND gate 32 is consequently the logical inverse of the $\overline{S_1}$ signal and comprises ten clock pulses occurring during the 1 gate pulse period as shown in FIG. 9. $S_1$ is anded with $S_6$ by the first AND gate 46. As a result, the output $S_7$ comprises ten clock pulses occurring during the 1 gate pulse period as shown in FIG. 9. $S_7$ is input to the first exclusive OR circuit 50 along with $S_1$. The truth table for the exclusive OR gate (see page 157 of the previously referenced RCA Databook) is such that the output $S_8$ thereof is a logical 0 when the inputs are either both 0's or both 1's. Consequently, for the inputs $S_1$ and $S_7$ shown in FIG. 9, the output $S_8$ will be a logical 0 which does not cause the output $S_9$ of the first flip-flop 92 to change state. As a result, the logical 0 (0 volts) appearing at the output prevents the transistor 104 in the first indicator circuit 96 from turning on and supplying power to the light emitting diode 108 (see FIG. 6).

The $S_1$ signal is also or'd with the $S_6$ signal by the OR gate 48 which results in an output signal $S_{10}$ comprising 10 clock pulses occurring the 1 gate pulse period as shown in FIG. 9. The signal $S_{10}$ is input to the second exclusive OR gate 52 along with $S_1$. The output $S_{11}$ from the second exclusive OR gate 52 will be a logical 0 which, as stated previously, will not cause the associated indicator circuit 118 to activate the light emitting diode contained therein.

Consequently, neither the first indicator circuit 96, which as shown in FIG. 1 corresponds to an open circuit indicator in the G1-$K_R$ circuit, nor the second indicator circuit 118, which corresponds to a short circuit indicator in the G1-$K_R$ circuit, will be activated. Note that the section of the logic diagram enclosed by the dotted line 161 is repeated three additional times. These three sections were omitted from FIG. 1 for reasons of clarity. The first additional section is connected to the $K_B$ terminal pin 128 and indicates opens in the G1-$K_B$ circuit as well as G1-$K_B$ shorts. The second additional section is connected to the $K_G$ terminal pin 122 and indicates opens in the G1-$K_G$ circuit as well as G1-$K_G$ shorts. The third additional section is connected to the G2 terminal pin 156 and indicates opens in the G1-G2 circuit as well as G1-G2 shorts. The operation of these three additional sections is the same as that described for the section enclosed by the dotted line 161.

Figure 10:
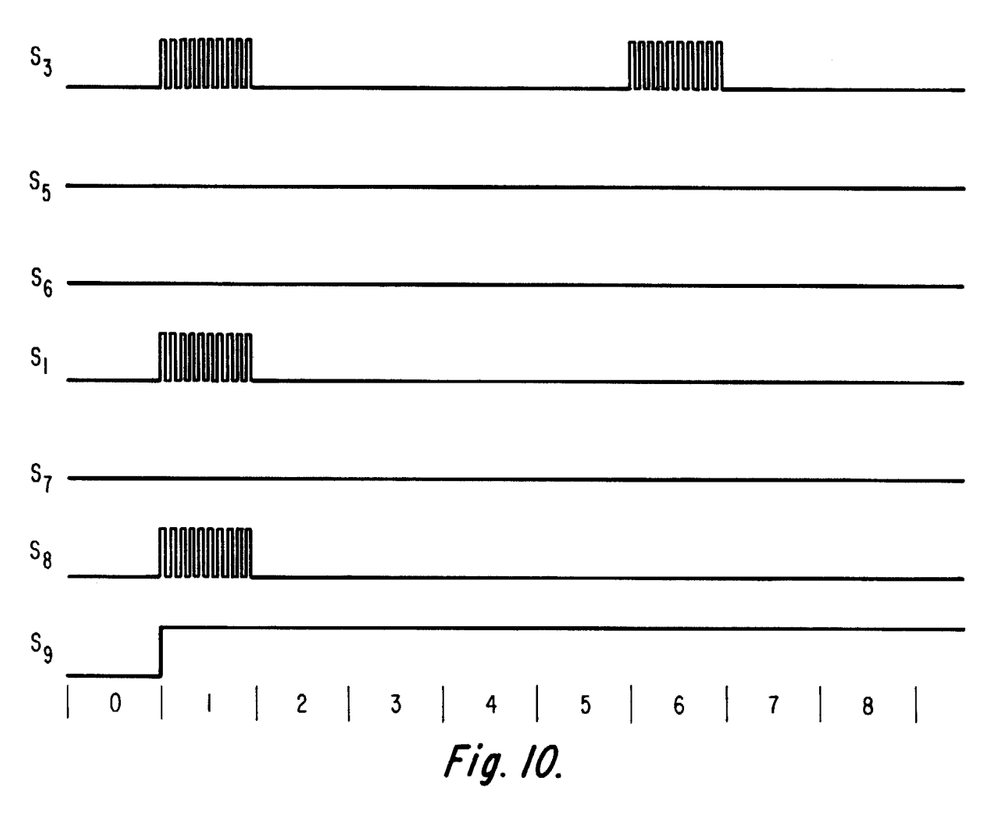
FIG. 10 is a timing diagram showing the timing sequence for a mount assembly having an open circuit.

FIG. 10 depicts the timing sequence for a mount assembly having an open in the G1-$K_R$ circuit. As usual, the $S_3$ signal is applied to the G1 terminal 40. As previously stated, G1-$K_R$ open circuit measurements take place during the 1 gate pulse intervals. Since an open circuit exists, there will be no $S_5$ signal appearing at the $K_R$ terminal 80 during the 1 gate pulse interval. Consequently, the output $S_6$ from the level detector 76 will be a continuous logical 0 during this interval and when anded with $S_1$ will produce an output $S_7$ from the first AND gate 46 which also has a continuous logical 0 level. $S_7$, being continuously 0, will cause the output $S_8$ from the first exclusive OR gate 50 to change state in consonance with the $S_1$ signal. The first clock pulse in the $S_8$ signal will cause the output $S_9$ of the first flip-flop 92 to change state from a logical 0 (0 vole) to a logical 1 (+4 volt). The +4 volt level corresponding to a logical 1 is applied to the base of the transistor 104 in the first indicator circuit 96 causing power to be applied to light the light emitting diode 108 signifying to the operator than an open exists in the G1-$K_R$ circuit.

Figure 11:
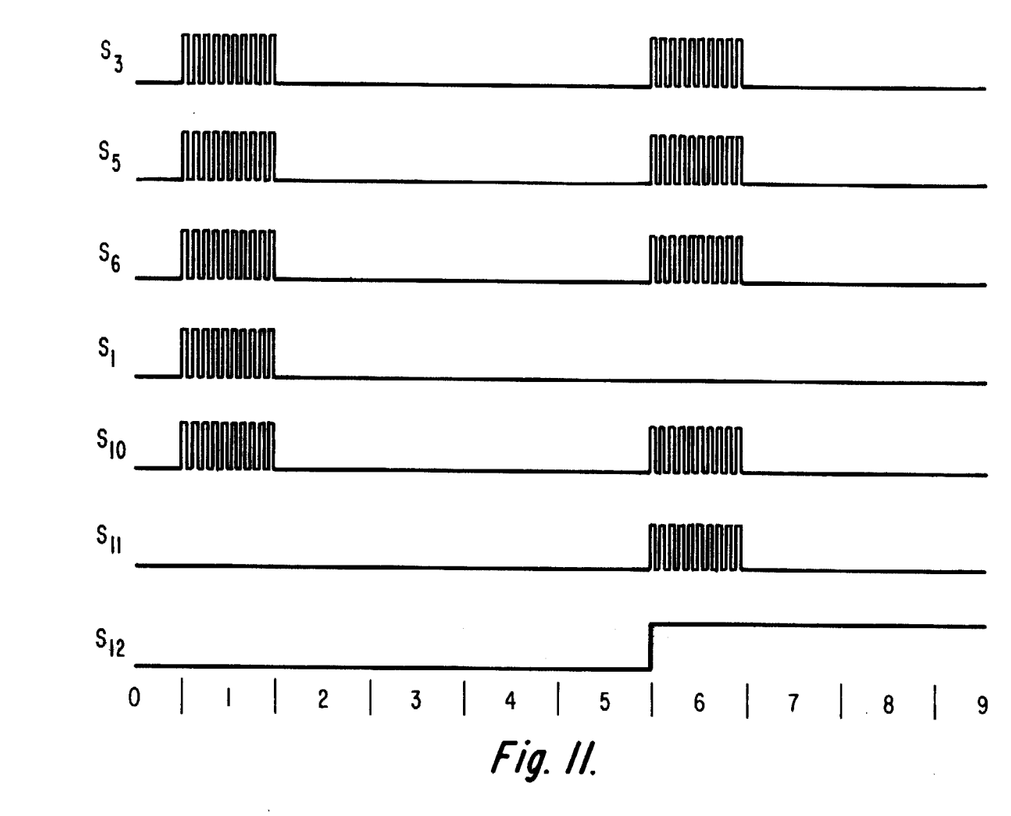
FIG. 11 is a timing diagram showing the timing sequence for a mount assembly having a short circuit.

FIG. 11 depicts the timing sequence for a mount assembly having a short in the G1-$K_R$ circuit. The $S_3$ signal is applied to the G1 electrode by way of the G1 terminal pin 40. As previously stated, G1-$K_R$ short circuit measurements take place during the 6 gate pulse interval. Since a short circuit exists, the $S_5$ signal will include clock pulses during the 6 gate pulse interval having an amplitude substantially equal to the amplitude of the $S_3$ pulses, this amplitude being +12 volts in the preferred embodiment. As described before, the $S_4'$ signal applied to the level detector 76 changes from +4 volts to +12 volts following the 2 gate pulse interval. Consequently, although $V_{NL}$ is +3.6 volts during the 6 gate pulse interval, the +12 volt pulses of the $S_5$ signal will cause the output logic level to change state. As a result, the output $S_6$ from the level detector 76 will comprise clock pulses occurring during the 6 gate pulse interval which, when or'd with the $S_1$ signal, will produce an output $S_{10}$ from the OR gate 48 which comprises clock pulses occurring during the 6 gate pulse interval. Since the $S_1$ signal is a continuous logical 0 during the 6 gate pulse interval and the $S_{10}$ signal comprises clock pulses during this interval, $S_1$ gated with $S_{10}$ by the second exclusive OR gate 52 will produce an output signal $S_{11}$ comprising clock pulses which occur duing the 6 gate pulse interval. The first clock pulse in the $S_{11}$ signal will cause the output $S_{12}$ of the second flip-flop 114 to change from a logical 0 state (0 volt) to a logical 1 state (+4 volts). The +4 volts corresponding to a logical 1 is applied to the base of the transistor 104 in the second indicator circuit 118 causing the light emitting diode 108 to light thereby signifiying a short circuit exists in the G1-$K_R$ circuit.

Figure 12:
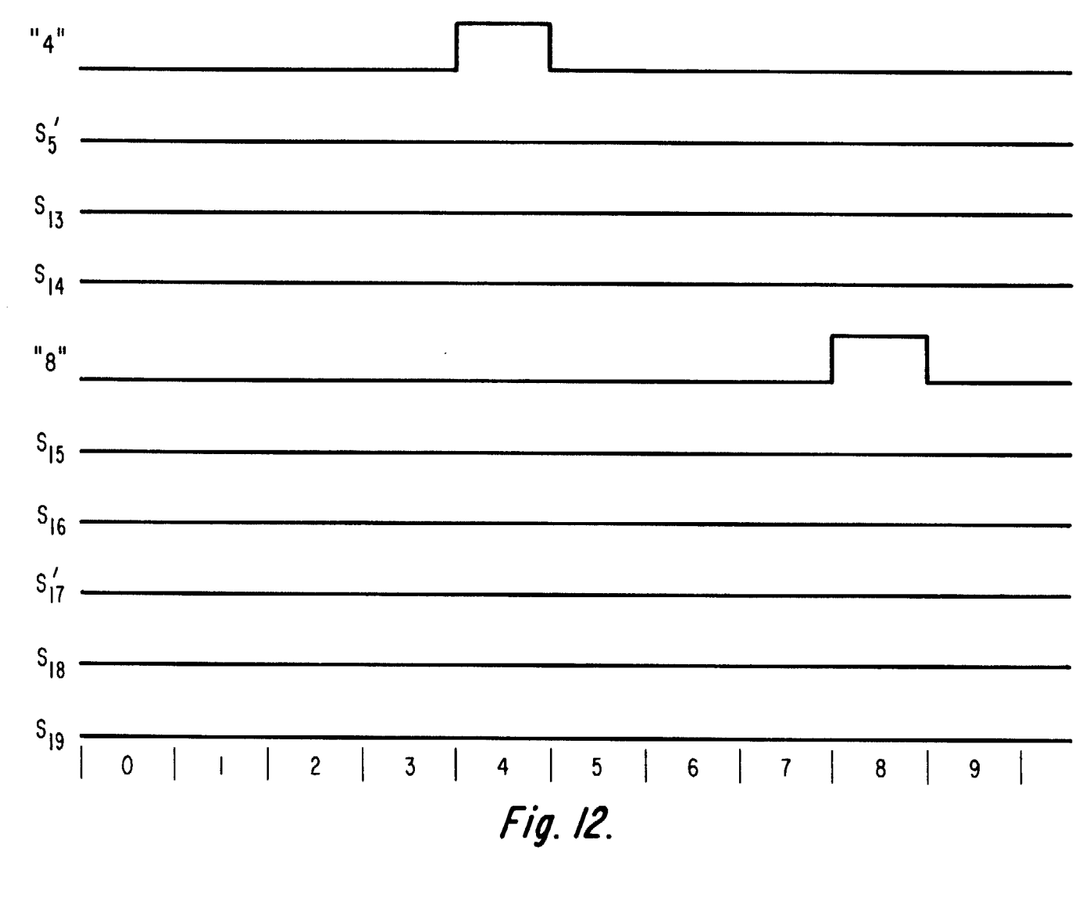
FIG. 12 is a timing diagram showing the timing sequence for a mount assembly having no short circuit.
Figure 13:
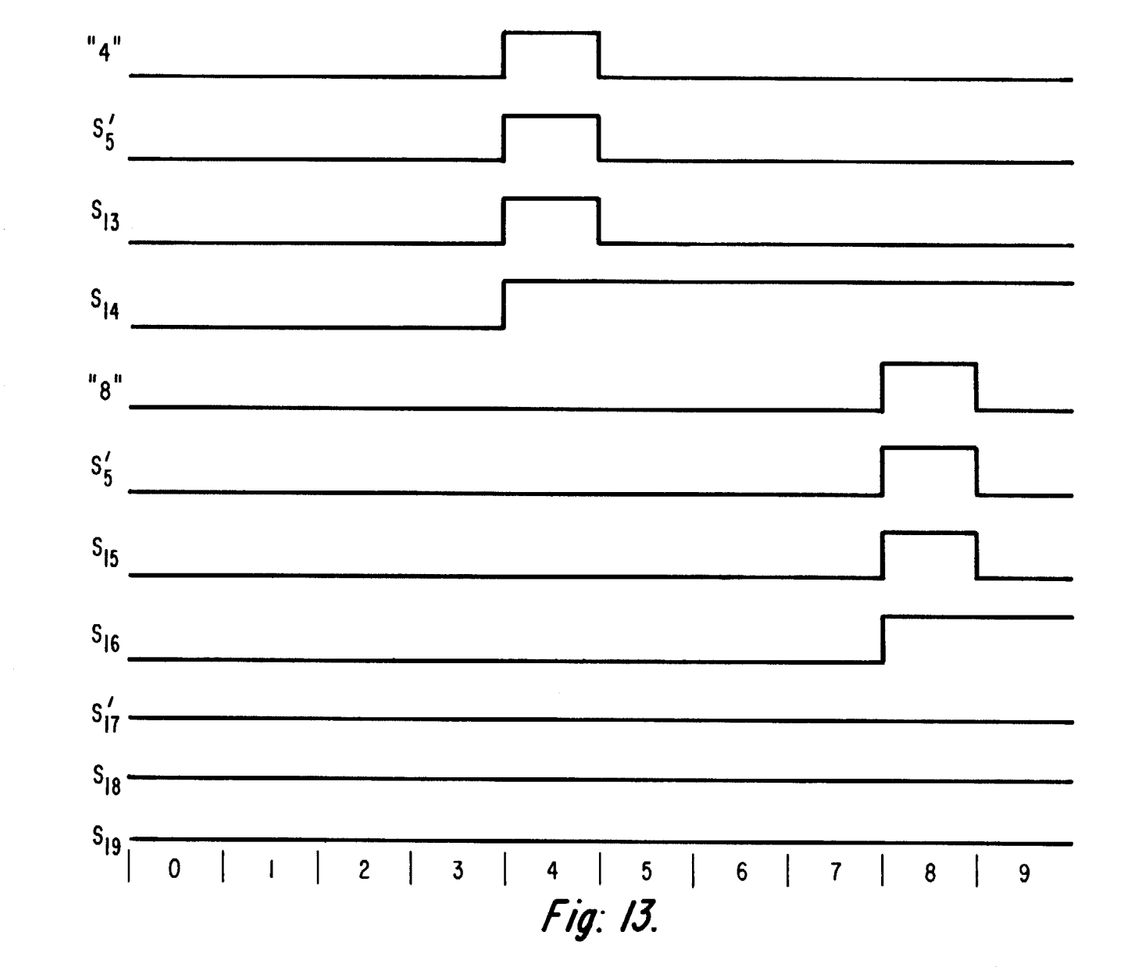
FIG. 13 is a timing diagram showing the timing sequence for a mount assembly having intercathode-electrode short circuits.

As previously stated, the $K_G$-$K_R$ short circuit measurement occurs during the 4 gate pulse interval. Referring to FIGS. 1, 12 and 13, the 4 gate pulse is applied to the $K_G$ terminal 122. The 4 gate pulse is also anded with the signal appearing at the $K_R$ terminal pin 80 by the second AND gate 82. In a mount having no short circuit between the red and green cathodes $K_R$ and $K_G$ (see FIG. 12), there will be no signal appearing at the $K_R$ terminal, a situation equivalent to a logical 0. Consequently, the output $S_{13}$ from the second AND gate 82 will be a logical 0 (0 volt) which will not cause the output $S_{14}$ of the third flip-flop 132 to change state, thereby preventing the transistor 104 in the third indicator circuit 144 from turning on and supplying power to the light emitting diode 108 as previously described. If a short circuit existed between the red and green cathodes $K_R$ and $K_G$, the signal $S_5'$ appearing at the $K_R$ terminal would be the 4 gate pulse (see FIG. 13) which, when anded by the second AND gate 82, would cause the output signal $S_{13}$ to rise to a logical 1 (+12 volts) which in turn would cause the output $S_{14}$ of the third flip-flop 132 to change state. That is, $S_{14}$ would rise to a logical 1 (+4 volts). The +4 volt logical 1 signal is applied to the base of the transistor 104 in the third indicator circuit 144 causing the transistor to turn on and power the light emitting diode signifying a $K_R$-$K_G$ short circuit.

The $K_B$-$K_R$ and $K_B$-$K_G$ short circuit measurements occur during the 8 gate pulse interval as previously stated. Referring to FIGS. 1 and 13, the 8 gate pulse is applied to the $K_B$ terminal pin 128. The 8 gate pulse is also anded with the signals appearing at the $K_R$ and $K_G$ terminals by the third 84 and fourth 124 AND gates respectively. In a mount assembly having no $K_B$-$K_R$ or $K_B$-$K_G$ short circuits, there will be not signal appearing at either the $K_R$ or $K_G$ terminals. Consequently, the outputs $S_{15}$ and $S_{18}$ from the third and fourth AND gates 84 and 124 respectively, will be logical 0's (0 volts) which will not cause the outputs $S_{16}$ and $S_{19}$ of the fourth and fifth flip-flops 136 and 140 respectively to change state. Consequently, the light emitting diodes in fourth and fifth indicator circuits 148 and 154 respectively will not light.

If a short circuit existed, for example, between the blue and green cathodes $K_B$ and $K_G$, the signal appearing at the $K_G$ terminal 122 would be the 8 gate pulse (see FIG. 13) which, when anded by the fourth AND gate 124, would cause the output signal $S_{18}$ to rise to a logical 1 (+4 volts) which in turn would cause the output $S_{19}$ of the fifth flip-flop 152 to change state, i.e., $S_{19}$ would rise to a logical 1 (+4 volts). The +4 volt logical 1 signal is applied to the base of the transistor 104 in the fifth indicator circuit 152 causing the light emitting diode to light which signifies a $K_B$-$K_G$ short circuit.

Thus it can be seen that the apparatus of the present invention applies, during an open circuit test interval defined by the 1 gate pulse interval, a sequence of ten input pulses of the terminal of the G1 electrode of the color television tube mount assembly. Each input pulse has an amplitude of approximately +12 volts and a duration of approximately 15 microseconds (see FIG. 2b). Also during the open circuit test interval, the apparatus detects the amplitude of the pulses appearing at the terminals of the $K_R$, $K_B$, $K_G$ and G2 electrodes. Any pulse having an amplitude of less than approximately +2.8 volts will cause the appropriate level detector to send a signal to the corresponding open circuit indicator. It should be noted that a missing pulse is construed as a pulse having an amplitude of 0 volts which would cause the appropriate open circuit indicator to turn on.

In addition, the apparatus of the present invention applies pulses to and detects responses at the electrodes during short circuit test intervals as follows. A single pulse, having an amplitude of approximately +12 volts, is applied to the terminal of the $K_G$ electrode during a first short circuit test interval defined by the 4 gate pulse interval. During the 4 gate pulse interval, the appropriate level detector detects the amplitude, if any, of the pulse appearing at the terminal of the $K_R$ electrode. If this pulse has an amplitude which exceeds approximately +3.6 volts, the level detector will send a signal causing the appropriate short circuit indicator to turn on. Next, a sequence of ten pulses, each having an amplitude of approximately 12 volts, is applied to the terminal of the G1 electrode during a second short circuit interval defined by the 6 gate pulse interval. During this second short circuit test interval, the apparatus detects the amplitudes, if any, of the pulses appearing at the terminals of the $K_R$, $K_B$, $K_G$ and G2 electrodes. Any pulse having an amplitude which exceeds approximately +3.6 volts will cause the appropriate level detector to send a signal to the corresponding short circuit indicator. Finally, a single pulse, having an amplitude of approximatey +12 volts, is applied to the terminal of the $K_B$ electrode during a third short circuit test interval defined by the 8 gate pulse interval. During this interval, the appropriate level detectors detect the amplitudes, if any, of the pulses appearing at the terminals of the $K_R$ and $K_G$ electrodes and a signal is sent to the corresponding circuit indicator if an amplitude exceeding approximately +3.6 volts is detected.

Using the apparatus and method of the present invention, it is possible to test for interelectrode short and open circuits without actually contacting the electrodes themselves. This is particularly advantageous where the electrodes themselves are sealed within an evacuated glass envelope thereby negating any possibility of direct electrical contact.

I claim:

1. An apparatus for measuring open and short circuits between electrodes of an electron tube having at least two electrodes, said apparatus comprising:
   a. means for applying, during an open circuit test interval, at least one input pulse to a terminal of a first electrode of said electron tube, each input pulse having a predetermined amplitude and duration;
   b. means for detecting, during said open circuit test interval, the amplitude of each open circuit test output pulse produced at a terminal of a second electrode of said electron tube in response to each of said open circuit test interval input pulses;
   c. means for indicating an open circuit upon measurement of an open circuit test interval output pulse amplitude having a magnitude which is less than a predetermined minimum value;
   d. means for applying, during at least one short circuit test interval, at least one input pulse to a terminal of an electrode, each input pulse having a predetermined amplitude;
   e. means for detecting, during each short circuit test interval, the amplitude of each output pulse produced at a terminal of at least one other electrode in response to each of said short circuit test interval input pulses; and
   f. means for indicating a short circuit upon measurement of a short circuit test interval output pulse amplitude having a magnitude which exceeds a predetermined maximum value.

2. An apparatus in accordance with claim 1 wherein said open circuit test interval input pulse application means comprises:
   i. clock means for generating a sequence of N pulses during said open circuit test interval;
   ii. means for generating a first gate pulse during said open circuit test interval, said gate pulse having a pulse duration substantially equal to said open circuit test interval; and
   iii. means connected to the terminal of said first electrode for gating said clock pulses with said first gate pulse to produce a first gated clock pulse signal comprising N clock pulses which occur only during said open circuit test interval.

3. An apparatus in accordance with claim 2 wherein said open circuit test output amplitude measuring means comprises:
   i. level detection means, connected to the terminal of said second electrode, for providing a first level detection output pulse in response to each open circuit test output pulse having an amplitude equal to at least said predetermined minimum value; and
   ii. means for gating the first level detection output pulses with the first gated clock pulse signal in order to produce an open circuit signal whenever an output pulse does not occur substantially coincident with a first gated clock pulse.

4. An apparatus in accordance with claim 3 wherein said open circuit indicating means comprises an indicator light which is illuminated in response to an occurrence of said open circuit signal.

5. An apparatus in accordance with claim 4 wherein said short circuit test interval input pulse application means comprises means connected to the terminal of said first electrode for generating a second gate pulse during said short circuit test interval, said second gate pulse having a pulse duration substantially equal to said short circuit test interval.

6. An apparatus in accordance with claim 5 wherein said short circuit test output pulse amplitude measuring means comprises means connected to the terminal of said second electrode for gating a short circuit output pulse, having an amplitude in excess of said predetermined minimum, with the second gate pulse whereby the occurrence of substantially coincident output and gate pulse causes the generation of a short circuit signal.

7. An apparatus in accordance with claim 6 wherein said short circuit indicating means comprises an indicator light which is illuminated in response to an occurrence of said short circuit signal.

8. An apparatus in accordance with claim 4 wherein said short circuit test interval input pulse application means comprises:
   i. clock means for generating a sequence of N pulses during said short circuit test interval;
   ii. means for generating a second gate pulse during said short circuit test interval, said second gate pulse having a pulse duration substantially equal to said short circuit test interval; and
   iii. means connected to the terminal of said first electrode for gating said clock pulses with said second gate pulse to produce a second gated clock pulse signal comprising N clock pulses which occur only during said short circuit test interval.

9. An apparatus in accordance with claim 8 wherein said short circuit test output pulse amplitude measuring means comprises:
   i. level detection means, connected to the terminal of said second electrode, for providing a second level detection output pulse in response to each short circuit test output pulse having an amplitude which exceeds said predetermined maximum value; and
   ii. means for gating the level detection output pulses with the second gated clock pulse signal whereby the occurrence of substantially coincident output and clock pulses causes the generation of a short circuit signal.

10. An apparatus in accordance with claim 9 wherein said short circuit indicating means comprises an indicator light which is illuminated in response to an occurrence of said short circuit signal.

11. A method of determining the existence of open and short circuits between electrodes of an electron tube having at least two electrodes, said method comprising the steps of:
   a. applying, during an open circuit test interval, at least one input pulse to a terminal of a first electrode of said electron tube, each input pulse having a predetermined amplitude and duration;
   b. detecting, during said open circuit test interval, the amplitude of each open circuit test output pulse produced at a terminal of a second electrode of said electron tube in response to each of said open circuit test interval pulses;
   c. indicating an open circuit upon measurement of an open circuit test interval output pulse amplitude having a magnitude which is less than a predetermined minimum value;
   d. applying, during at least one short circuit test interval, at least one input pulse to a terminal of an electrode, each input pulse having a predetermined amplitude;
   e. detecting, during each short circuit test interval, the amplitude of each output pulse produced at a terminal of at least one other electrode in response to each of said short circuit test interval input pulses; and
   f. indicating a short circuit upon measurement of a short circuit test interval output pulse amplitude having a magnitude which exceeds a predetermined maximum value.

* * * * *